United States Patent [19]

Wada et al.

[11] Patent Number: 5,160,995
[45] Date of Patent: Nov. 3, 1992

[54] SEMICONDUCTOR IC DEVICE WITH DUMMY WIRES

[75] Inventors: Satoshi Wada, Chigasaki; Shinichi Wakabayashi, Yokohama; Masayo Fukuda, Ninomiya, all of Japan

[73] Assignee: Kabushiki Kaisha Toshiba, Kawasaki, Japan

[21] Appl. No.: 737,605

[22] Filed: Jul. 25, 1991

Related U.S. Application Data

[63] Continuation of Ser. No. 552,082, Jul. 13, 1990, abandoned.

[30] Foreign Application Priority Data

Jul. 21, 1989 [JP] Japan .................. 1-189312

[51] Int. Cl.⁵ .............................................. H01L 27/02
[52] U.S. Cl. ...................................... 257/207; 257/210; 257/532
[58] Field of Search ................. 357/40, 51, 68, 71, 357/84, 45, 41

[56] References Cited

U.S. PATENT DOCUMENTS

| | | | |
|---|---|---|---|
| 4,916,514 | 4/1990 | Nowak | 357/68 |
| 4,958,222 | 9/1990 | Takakura et al. | 357/71 X |

FOREIGN PATENT DOCUMENTS

| | | |
|---|---|---|
| 59-198796 | 11/1984 | Japan . |
| 60-119749 | 6/1985 | Japan . |
| 61-125045 | 6/1986 | Japan . |
| 62-206855 | 9/1987 | Japan . |

*Primary Examiner*—William Mintel
*Assistant Examiner*—Roy Potter
*Attorney, Agent, or Firm*—Finnegan, Henderson, Farabow, Garrett and Dunner

[57] ABSTRACT

A plurality of cells providing constituent elements for a semiconductor integrated circuit are provided in and on a major surface of a semiconductor substrate of a semiconductor integrated circuit chip. A plurality of wires are each provided between a cell and a cell to provide cell-to-cell wires. A plurality of dummy wires are connected to an internal power source terminal of a second power source potential which is different from a first power source terminal. A capacitance is created between the dummy wire and the semiconductor substrate to prevent a voltage fluctuation at the power source. The dummy wires are selectively cut off the internal power source terminal of the second potential to correct a wrong connection line or a signal delay time.

7 Claims, 4 Drawing Sheets

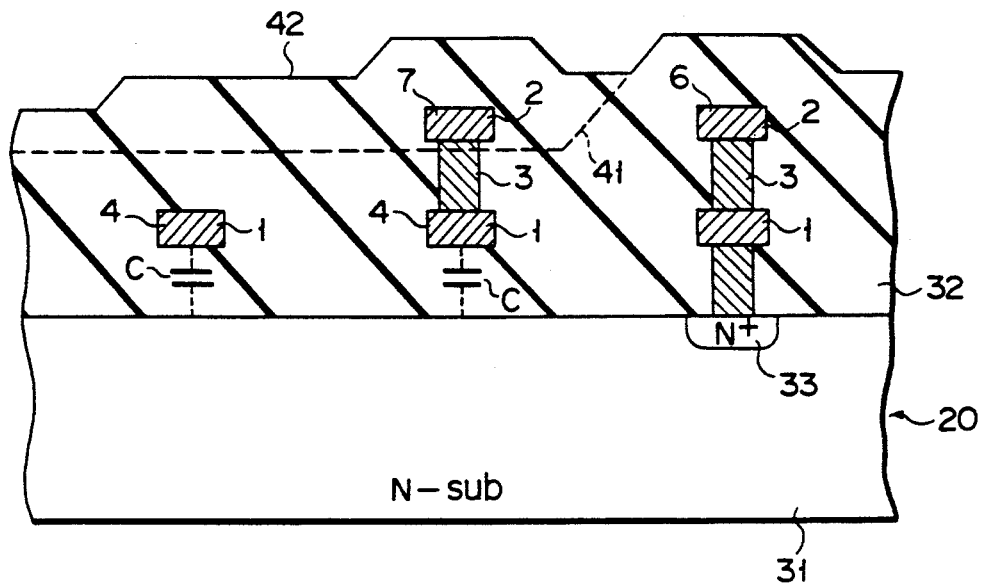
F I G. 3
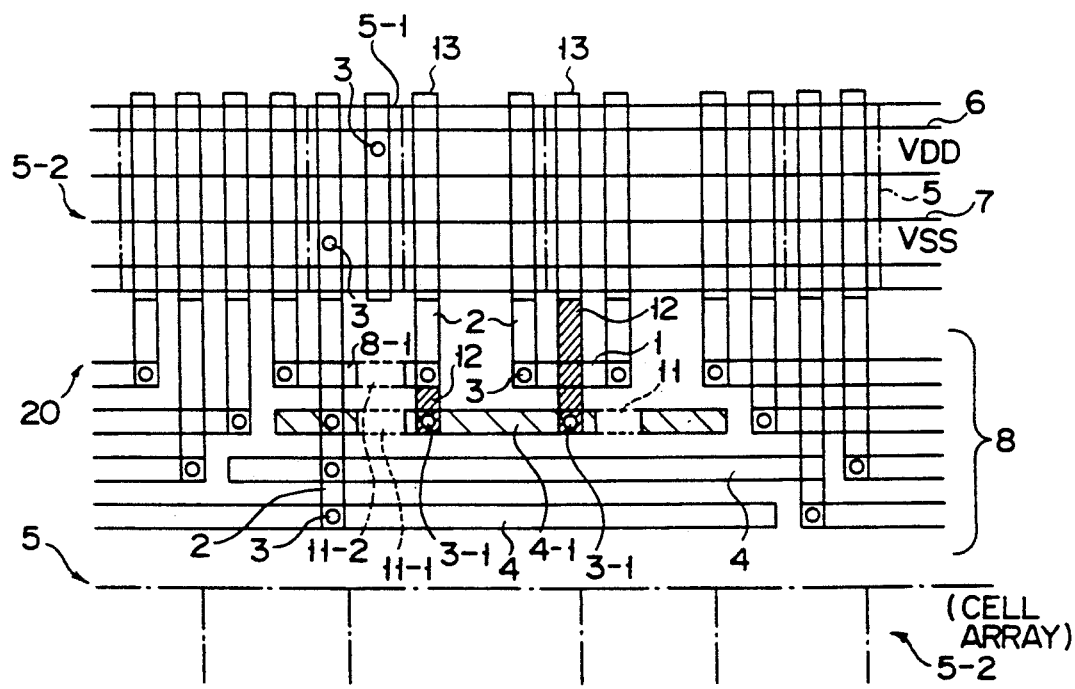
F I G. 4

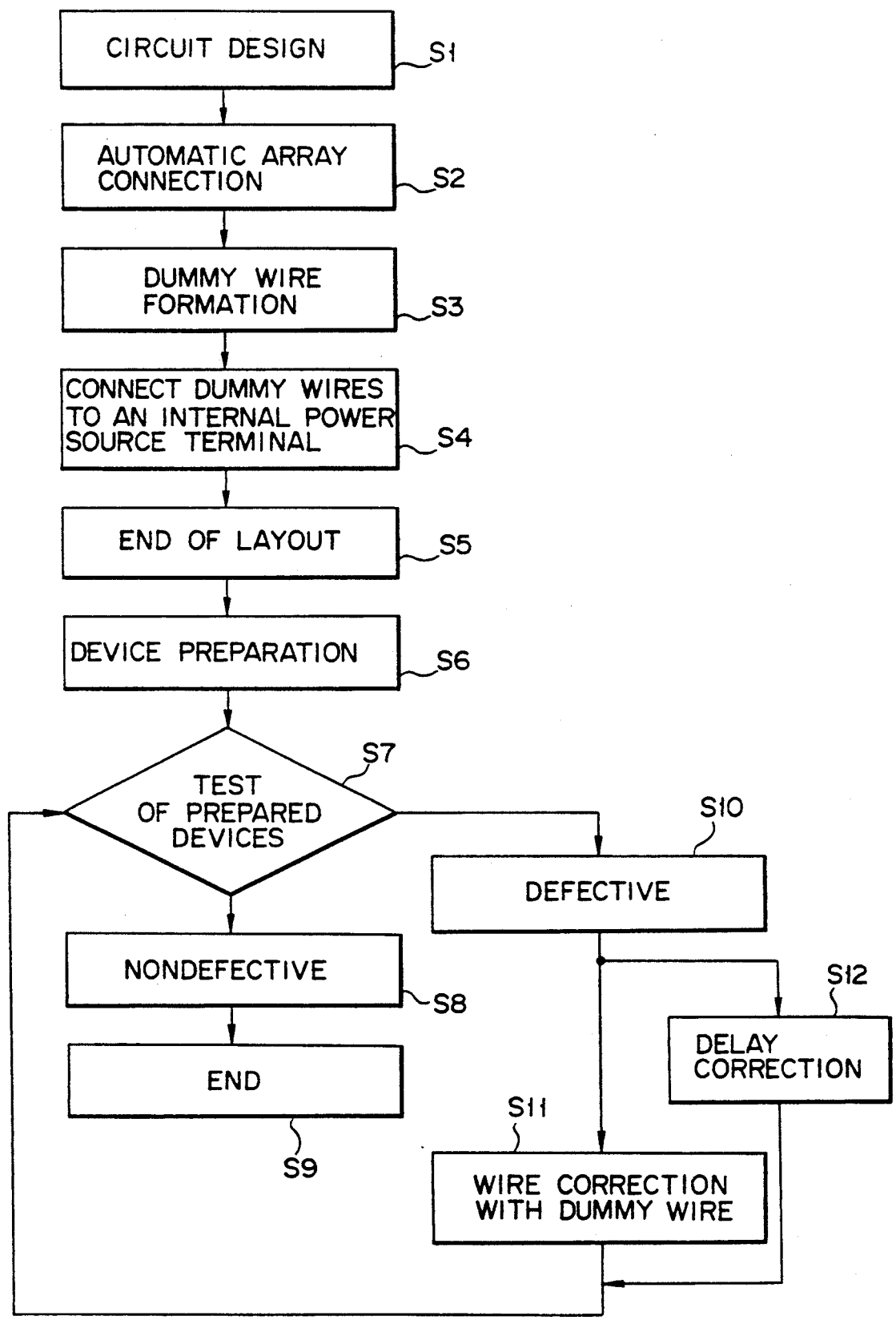
F I G. 6

SEMICONDUCTOR IC DEVICE WITH DUMMY WIRES

This application is a continuation of application Ser. No. 07/552,082, filed Jul. 13, 1990, now abandoned.

BACKGROUND OF THE INVENTION

1. Field of the Invention

The present invention relates to a semiconductor IC circuit device having dummy wires and a method for manufacturing the same, both of which are employed for a multi-layer type semiconductor integrated circuit to be formed by an automatic array connection system, such as a standard cell structure and a gate array structure.

2. Description of the Related Art

Dummy wires have conventionally been employed:

(1) to prevent an unevenness (a step) on the surface of a semiconductor integrated circuit resulting from a different wire density at a respective area in the same connection layer or to offer a countermeasure against a "loading effect" which is produced in the case where, if a single wire is provided in a broader connection area, it is broken apart due to a corrosion caused by etching— see Published Unexamined Japanese patent application No. 60-119749; and (2) to correct a wrongly connected line or layer in which case the dummy wires are arranged, at a given connection layer, for correction only and, if a semi-conductor device manufactured is defective, are employed to correct a defective spot or spots—Published Unexamined Japanese Patent Publication 59-198796, 61-125045 and 62-206855.

FIG. 1 is a plan view showing an IC pattern having conventional dummy wires. In FIG. 1, reference numeral 1 shows a first connection layer; 2, a second connection layer; 3, a connection through hole or a contact hole; 4, dummy wires; 5, an array of cells (it is assumed that they are formed by a standard cell system); 6, an internal power source terminal $V_{DD}$; 7, an internal power source terminal $V_{SS}$; and 8, cell-to-cell wires.

Conventional dummy wires have proved ineffective in both preventing an unevenness (a step) on the surface of integrated circuits while offering a countermeasure against a loading effect, and correcting a wiring or connection error, if any. In order to prevent such an uneven surface and to provide a countermeasure against such a loading effect, dummy wires 4 are used such that, as shown in FIG. 1, they have a proper width to serve the purpose for which they are formed. The dummy wires cannot be utilized in the conventional semiconductor devices due in part to a "not fixed" width and in part to its own limited use in particular. If they are initially built in a semiconductor IC device so as to correct a connection error, they sometimes prove fruitless for such a purpose as in the aforementioned case.

SUMMARY OF THE INVENTION

It is an object of the present invention to provide a semiconductor integrated circuit device which can readily prevent an internal power source voltage fluctuation and can readily correct a wrong connection line, or correct an improper signal delay time, with the use of dummy wires.

Another object of the present invention is to provide a method for manufacturing the aforementioned semiconductor integrated circuit device.

According to one aspect of the present invention, there is provided a semiconductor circuit device, comprising:

a semiconductor integrated circuit chip including a semiconductor substrate to which a first power source potential ($V_{DD}$) is supplied;

a plurality of cells provided as a cell array in and on a major surface of the chip and providing constituent elements of a semiconductor integrated circuit;

a plurality of cell-to-cell wires each arranged between the cells;

a plurality of dummy wires arranged at the same pitch and width as those at which the cell-to-cell wires are arranged, the plurality of dummy wires being connected to a second power source potential which is different from the first power source potential.

According to another aspect of the present invention, there is provided a method for manufacturing a semiconductor integrated circuit device, comprising the steps of:

forming dummy wires at the same pitch and width as those at which cell-to-cell wires are arranged for a plurality of cells which are formed in and on a major surface of the semiconductor integrated circuit chip and which provide constituent elements for the semiconductor integrated circuit, and connecting the dummy wires to an internal power source terminal of a second power source potential which is different from a first power source potential of a chip substrate; and electrically cutting at least one of dummy wires off the internal power source terminal line and correcting a wrong connection line with the cut-off dummy wire.

According to the present invention, dummy wires are arranged, for example, in a multi-layer type semiconductor integrated circuit and connected to an internal power source potential $V_{SS}$ line. A capacitance is provided between the dummy wires and the integrated circuit's substrate, thus preventing an internal power source voltage fluctuation and supplying a stable voltage to an associated internal circuit. The dummy wires are arranged at the same pitch and width as those at which cell-to-cell wires are arranged and, if a semiconductor integrated circuit is found to be defective, are cut off the internal power source terminal line to correct a wrong connection layer or an improper signal delay time. It is, thus, possible to shorten a manufacturing step of the semiconductor integrated circuit.

BRIEF DESCRIPTION OF THE DRAWINGS

FIG. 3 is a cross-sectional view schematically showing the semiconductor device of FIG. 2;

FIG. 4 is a plan view showing a pattern of a semiconductor integrated circuit according to another embodiment of the present invention;

FIG. 6 is a flowchart for manufacturing a semiconductor device by an automatic array connection system.

DETAILED DESCRIPTION OF THE PREFERRED EMBODIMENTS

The embodiment of the present invention will be explained below with reference to the accompanying drawings.

Figure 1:
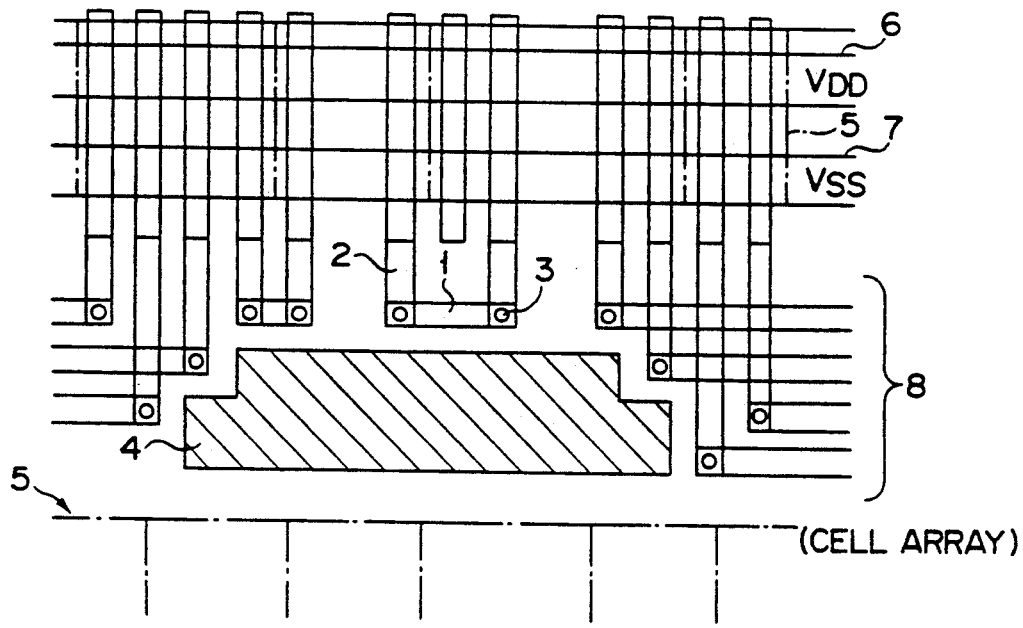
FIG. 1 is a plan view showing a conventional semiconductor circuit pattern.
Figure 2:
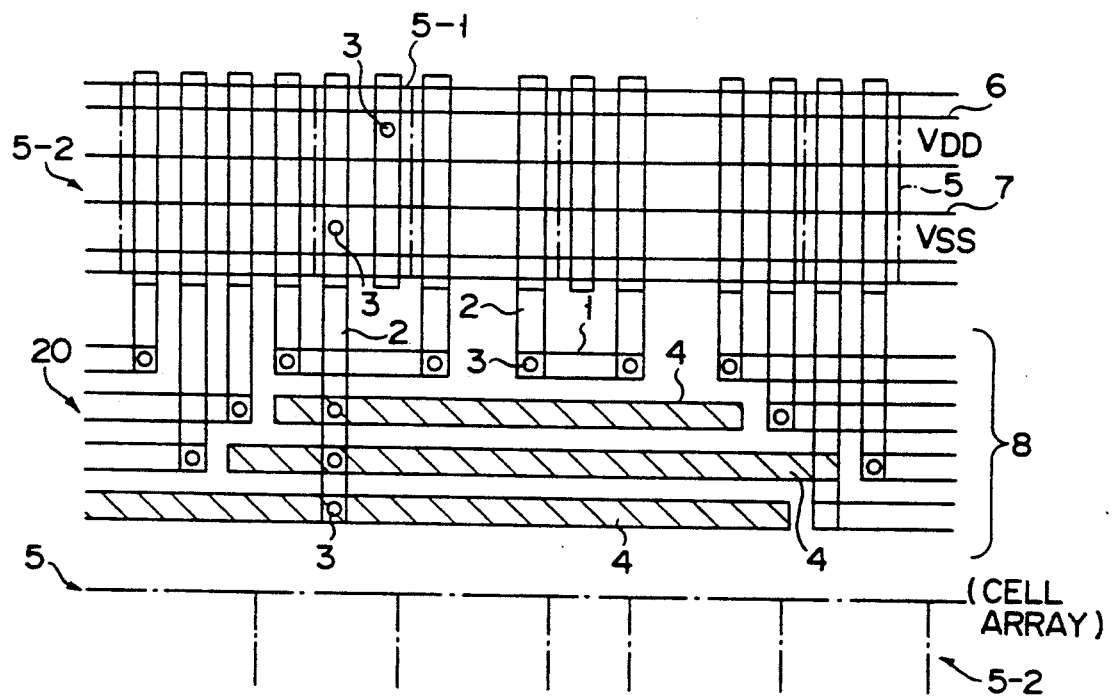
FIG. 2 is a plan view showing a pattern of a semiconductor integrated circuit according to a first embodiment of the present invention.

FIGS. 2 and 3 are a plan view and cross-sectional view, respectively, showing a major section of the present embodiment. In these Figures, the same reference numerals are employed to designate a portion or an element corresponding to that shown in FIG. 1. In the embodiment shown in FIG. 1, reference numeral 1 shows a first connection layer; 2, a second connection layer; 3, a connection through-hole or a contact hole; 4, dummy wires; 5, an array of cells (it is assumed that an integrated circuit is formed by a standard cell system); 6, an internal power source terminal $V_{DD}$; 7, an internal power source terminal $V_{SS}$; and 8, cell-to-cell wires.

These (1 to 8) are formed on an N type semiconductor substrate 31 of a chip 20 for forming a semiconductor integrated circuit. Reference numeral 32 shows an insulating film with which the portions or elements (1 to 8) are surrounded over the substrate 31. The first connection layer 1 to the right in FIG. 3 is composed of, for example, a first wire of aluminum and connected via the contact hole in the insulating film 32 to an $N^+$ type diffusion region 33 which is formed in the surface portion of the N type substrate 31. The second connection layer 2 to the right in FIG. 3 is composed of, for example, a second wire of aluminum and supplies a substrate potential $V_{DD}$ to the first connection layer 1 via the contact hole 3 in the insulating film 22. The second connection layer 2 as shown at the middle in FIG. 3 supplies a potential $V_{SS}$ to the first connection layer 1. A dummy wire 4 as shown at the middle in FIG. 3 is connected by the connection layer 2 to a dummy wire 4 to the left in FIG. 3 (see FIG. 2) and a capacitance C is created by these dummy wires 4, substrate 31 and their surrounding insulating film 32. The present embodiment is characterized in that the dummy wires 4 are provide at the same pitch and connection width as those of cell-to-cell wires 8 without being electrically connected to the wires 8. FIG. 2 shows an example in which the dummy wires 4 are used to stabilize an internal power supply voltage through the capacitance C. In the present embodiment, all dummy wires 4 thus provided are connected to the internal power source terminal $V_{SS}$ as opposed to the internal power source terminal $V_{DD}$. The connection between the dummy wires 4 and the internal power source terminal 7 is achieved by a special cell 5-1 for their own connection only. At the time of layout, at least one such cell (5-1) may properly be arranged at a respective cell array 5-2. In the case where a semiconductor circuit manufactured is defective, an associated dummy wire 4 for internal power supply potential stabiization is electrically cut off from the internal power source $V_{SS}$ line 7 for connection correction.

Using the dummy wire for connection correction will be explained below with reference to FIG. 4. In the neighborhood of a spot for which a correction is to be performed, a dummy wire 4 (represented by 4-1 in FIG. 4) whose length is fitted for correction is selected, followed by the removal of the surrounding insulating film 32 at the upper location (see FIG. 3) and the cutting-off of the dummy wire 4-1, by a laser beam for example, at a cutting spot 11-1. By so doing, a contact hole 3-1 is formed at the dummy wire 4-1 and an additional wire 12 is formed with the use of an aluminum evaporation method, connecting the wire 4-1 to the wire 2 and hence the dummy wire 4-1 to the cell wire 13. Then a wrongly connected wire 8-1 is electrically isolated, by a laser beam for example, at a cutting spot 11-2. If, at this time, a wire of a greater length is required, a plurality of dummy wires can be used instead for connection correction. Those dummy wires 4 other than those wires employed for correction are left connected to the internal power source $V_{SS}$ line as opposed to the internal power source $V_{DD}$ line.

Figure 5:
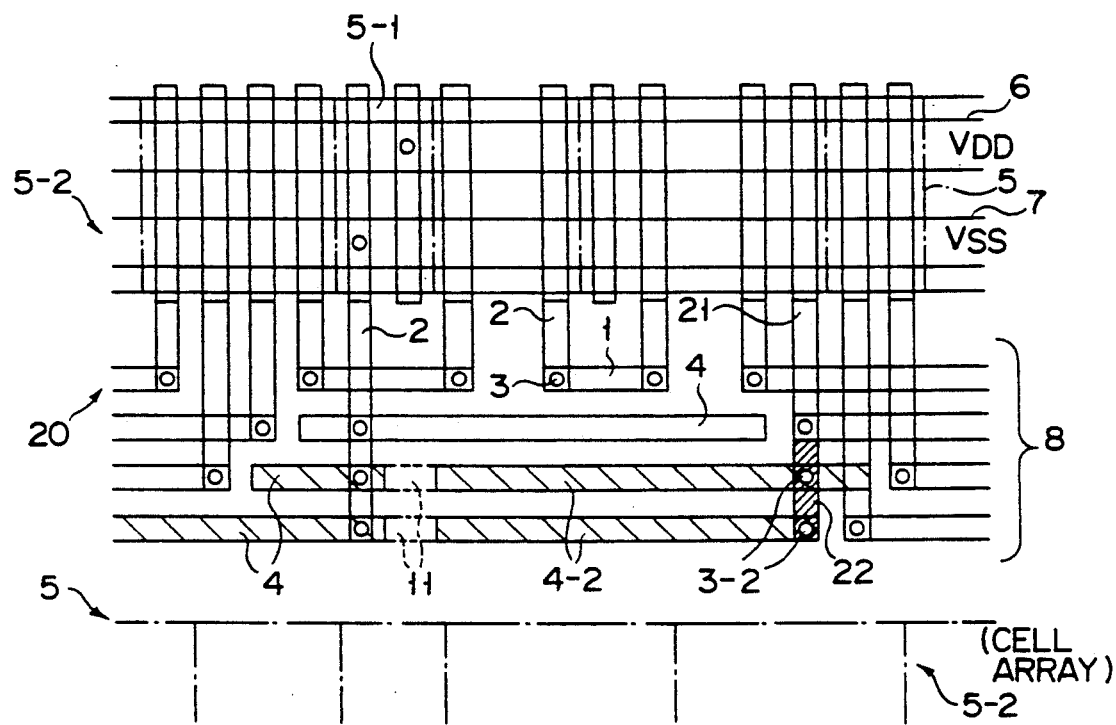
FIG. 5 is a plan view showing a pattern of a semiconductor device according to another embodiment of the present invention.

The dummy wire can also be used for the internal circuit's signal delay correction by electrically cutting the dummy wire off the internal power source line. FIG. 5 shows an example for using a dummy wire for delay correction. A dummy wire 4 (represented by 4-2 in FIG. 5) of a length fitted for delay correction is selected near an output 21 of a logic circuit whose delay time, for example, is to be varied. This dummy wire is electrically cut off the internal power source line at a cutting spot 11, providing a wire 4-2 for delay correction. Then the delay correction wire 4-2 is connected to an output 21 of the logic circuit by an additional wire 22 via a contact hole 3-2 which has been provided before the formation of the additional wire. This connection steps can be carried out as in the case shown in FIG. 4. The correction of a delay time is achieved by giving a proper length to the dummy wire 4-2 to be connected. Those dummy wires 4 other than those employed for a delay purpose are all left connected to the internal power supply terminal $V_{SS}$ line as opposed to the internal power supply terminal $V_{DD}$ line.

By way of example, a method for obtaining the arrangements of FIGS. 2 to 5 by a standard cell system will be explained below in more detail.

Step S1 performs an IC design including a pattern as shown in FIG. 6. An automatic connection layout is performed at step S2 with the use of, for example, a layout CAD. In the connection layout at step S2, a cell 5-1 for a power source connection only is included, but dummy wires 4 are not included. At steps S3, dummy wires are provided at an unoccupied proper area on the connection layout. The dummy wire 4 is connected to an internal power source terminal line 2 at step S4. The automatic connection layout is completed a step S5. At step S6, an actual device (an integral circuit including the arrangement shown in FIG. 2) is prepared based on a resultant connection pattern layout at step S5. At step S7, the device thus fabricated is tested for its state. Step S9 is terminated if it is determined at step S8 that the device is not defective. If, at a result of testing, the device is determined as being defective at step S10 and the defectiveness is found as being caused by a wrongly connected wire, connection correction is made at step S11 with the use of a dummy wire 4. If, on the other hand, the device is determined as being defective due to an incorrectness of a delay time in the integrated circuit involved, a connection correction is carried out, at step S12, with the use of the dummy wire 4. After the correction has been made at step S11 or S12, control goes back to step S7 to perform a test again. The correction operation is performed in a closed loop including steps S7→S10→S11 or S12→S7 until no defectiveness is found at step S8.

According to the present method, the dummy wire 4 is connected to the internal power source $V_{SS}$ terminal line which is opposite in potential to the substrate of the chip 20 as shown, for example, in FIGS. 2 and 3. By so doing, a capacitance C is created between the IC substrate 31 and the dummy wire 4 and connected to the internal power supply terminal 7. It is, therefore, possible to prevent a voltage fluctuation of the internal power source terminal and to supply a stable voltage to an internal circuit. The dummy wires 4 are formed at the same rate and width as those at which cell-to-cell wires 8 are arranged, making it possible to effect a connection correction as well as a delay time correction. For connection correction, as shown in FIG. 4, the dummy wire 4-1 connected to the internal power source terminal 7 is electrically cut off the internal power source terminal 7. It is, therefore possible to readily make the aforementioned correction operations in a short period of time. Those dummy wires left unused for correction are connected to the internal power source $V_{SS}$ terminal, serving to stabilize a power source potential. For delay time correction as shown in FIG. 5, it is necessary in the prior art to newly add a cell or cells to an associated device, to restart a layout design and to prepare mask formation data all over again. According to the present invention, however, it is only necessary to provide the dummy wire 4-2, contact hole 3-2 and additional wire 22 as set out above. It is, thus, possible to readily make a delay time correction without adding a new cell or cells to the device, to correct only those connection layers calling for correction, over again, even in terms of mask preparation data, and to shorten the operation steps involved. These dummy wires left unused for correction are utilized for internal power source potential stabilization because they are connected to the internal power source terminal.

According to the present invention, since the dummy wires are provided as set forth above, a wire density in the same connection layer can be made more uniform than that at which cell-to-cell wires alone are provided at that connection layer, reducing an extent of step (unevenness) on the surface of the integrated circuit resulting from a difference in wire density. The presence of the dummy wires 4 thus arranged ensures a uniform wire density against a "loading effect" which is produced in the case where, if a single wire alone, for example, is provided in a broader connection area, it is broken apart due to a corrosion developed at an etching step. In FIG. 3, a broken line 41 represents a layer surface state of an integrated circuit in which no dummy wires 4 are provided and a solid line 42 represents a layer surface state of the integrated circuit in which dummy wires are connected. From FIG. 3 it will be seen that the surface 42 of the integrated circuit is less stepped than the surface 41 of the integrated circuit.

The present invention is not restricted to the aforementioned embodiment only. Various changes and modifications of the present invention can be made without departing from the spirit and scope of the present invention. Although the present invention has been explained as being applied to the integrated circuit using the aforementioned standard cell system, it can also be applied to, for example, an integrated circuit using an automatic array connection system, such as a gate array system utilizing a basic cell. In the arrangement as shown in FIGS. 4 and 5, the wire is connected to a proper connection line or layer by the etch-back of the insulating film 32, the cutting of the connection line by a laser beam, formation of a contact hole, formation of an additional connection line (12, 22) by an aluminum evaporation method, etc. If, however, the defective spot or spots can be confirmed through such correction, it is only necessary to correct preceding data by changing mask preparation data in the same way as in the case where, when a device is again to be prepared, correction is made with an associated dummy wire against the mask preparation data before correction. It is thus possible to shorten an operation process involved.

What is claimed is:

1. A semiconductor integrated circuit device comprising:
    a semiconductor integrated circuit chip including a semiconductor substrate to which a first power source potential is supplied;
    at least two cell arrays each extending in a longitudinal direction, and each having a plurality of cells arranged in parallel on a major surface of said semiconductor substrate;
    a plurality of cell-to-cell wires in a region between said at least two cell arrays, said cell-to-cell wires extending in the longitudinal direction;
    a plurality of dummy wires in the region between said at least two cell arrays, said dummy wires extending in the longitudinal direction, said dummy wires having the same pitch and width parallel to the major surface and transverse to the longitudinal direction as the cell-to-cell wires, and said dummy wires being connected to an internal power source terminal having a second power source potential which is different from the first power source potential; and
    a connection layer connected to the second power source potential and said dummy wires, the connection layer being transverse to the dummy wires;
    wherein said dummy wires provide means for stabilizing the second power source potential.

2. The semiconductor circuit device according to claim 1, wherein said semiconductor integrated circuit is formed by an automatic array connection system.

3. The semiconductor circuit device according to claim 1, wherein said dummy wires and second power source potential terminal are connected by a specific cell for their own connection only and the specific cell is incorporated into said cell array of the semiconductor integrated circuit.

4. A semiconductor integrated circuit device, comprising:
    a semiconductor integrated circuit chip including a semiconductor substrate to which a first power source potential is supplied;
    at least two cell arrays each extending in a longitudinal direction, and each having a plurality of cells arranged in parallel on a major surface of said semiconductor substrate;
    a plurality of cell-to-cell wires in a region between said at least two cell arrays, said cell-to-cell wires extending in the longitudinal direction; and
    a plurality of dummy wires in the region between said at least two cell arrays, said dummy wires extending in the longitudinal direction, said dummy wires having the same pitch and width parallel to the major surface and transverse to the longitudinal direction as the cell-to-cell wires, and said dummy wires being connected to an internal power source terminal having a second power source potential which is different from the first power source potential;
    wherein said dummy wires simultaneously provide means for repairing wires and for mitigating unevenness on a surface of the semiconductor integrated circuit.

5. The semiconductor integrated circuit device according to claim 4, wherein said dummy wires provide means for delay correction.

6. The semiconductor integrated circuit device according to claim 5, wherein said dummy wires provide means for stabilizing the second power source potential.

7. A semiconductor integrated circuit device according to claim 4, further comprising a connection layer connected to the second power source potential and said dummy wires, the connection layer being transverse to the dummy wires.

* * * * *